United States Patent
Chung (10) Patent No.: US 7,301,217 B2
(45) Date of Patent: Nov. 27, 2007

(54) DECOUPLING CAPACITOR DESIGN

(75) Inventor: Shine Chien Chung, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 339 days.

(21) Appl. No.: 10/993,711

(22) Filed: Nov. 19, 2004

(65) Prior Publication Data

US 2005/0236690 A1 Oct. 27, 2005

Related U.S. Application Data

(60) Provisional application No. 60/565,203, filed on Apr. 23, 2004.

(51) Int. Cl.
*H01L 29/00* (2006.01)
*H01L 29/94* (2006.01)

(52) U.S. Cl. .............................. 257/532; 257/E29.345; 361/306.2; 361/734

(58) Field of Classification Search ................ 275/532, 275/312, E27.049, E27.05, E29.344, E29.345; 361/306.2, 734; 327/537, 594, 390, 391
See application file for complete search history.

(56) References Cited

U.S. PATENT DOCUMENTS

| | | | | |
|---|---|---|---|---|
| 4,929,989 A | * | 5/1990 | Hayano | 257/296 |
| 6,051,876 A | * | 4/2000 | Gardner et al. | 257/634 |
| 6,347,026 B1 | * | 2/2002 | Sung et al. | 361/56 |
| 2003/0193771 A1 | * | 10/2003 | Liao | 361/306.2 |

FOREIGN PATENT DOCUMENTS

JP 10256489 A * 9/1998

OTHER PUBLICATIONS

English translation of JP 10-256489.*

* cited by examiner

*Primary Examiner*—Matthew C. Landau
(74) *Attorney, Agent, or Firm*—Duane Morris LLP (57) ABSTRACT

A thin-dielectric unit capacitor is disclosed having a first node coupled to a first circuit connection point and a second node coupled to a second circuit connection point. It further contains a first and second thin-dielectric capacitors connected in series between the first and second nodes, wherein a thickness of a gate dielectric for each thin-dielectric capacitor is less than 50 angstroms.

13 Claims, 6 Drawing Sheets

DECOUPLING CAPACITOR DESIGN

The present invention claims the benefit under 35 U.S.C. §119(e) of U.S. provisional application No. 60/565,203 filed Apr. 23, 2004.

BACKGROUND

The present invention relates generally to capacitors for integrated circuits, and more particularly to stacking thin-dielectric decoupling capacitors for integrated circuits showing high unit capacitance.

In a normal configuration of semiconductor chips, power lines and ground lines are routed to logic gates in integrated circuits. The current from power supply flows through power lines, logic gates, and finally to ground. During the switching of the logic gates, a large amount of changes in the current occurs within a short period of time. Decoupling capacitors are used to absorb these glitches during current switching and to maintain a constant voltage between supply voltage and ground. Good decoupling capacitors should show high capacitance per unit area, low leakage current and short time constant. There are three kinds of conventional decoupling capacitors commonly used in integrated circuits, namely inter-digital fringing metal or poly capacitors, area Metal-Isolator-Metal (MiM) capacitors, area Poly-Isolator-Poly (PIP) capacitors and thin-dielectric capacitors.

Figure 1A:
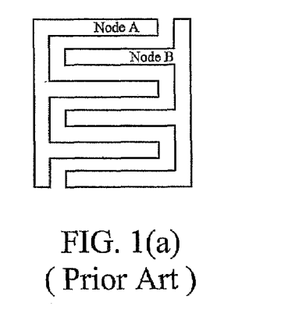
FIG. 1(a) presents a top view of an inter-digital fringing capacitor.

FIG. 1(a) presents a top view of an inter-digital fringing capacitor. The inter-digital fringing capacitors are formed in the same metal layer with multiple-finger electrodes. The capacitance of an inter-digital fringing capacitor is determined by the spaces between these electrodes and density of the electrodes. The time constant of inter-digital fringing capacitors is very short. However, because the minimum metal-to-metal space is limited, the unit capacitance is low. The inter-digital fringing capacitors are commonly made of metal or poly.

Figure 1B:
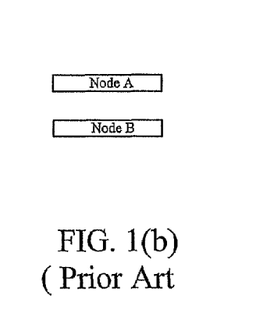
FIG. 1(b) presents a cross-sectional view of an MiM capacitor.

FIG. 1(b) presents a cross-sectional view of an MiM capacitor. An MiM capacitor comprises two conductive metal layers and a dielectric isolator layer. The capacitance is formed between these two conductive metal layers. MiM capacitors can achieve both high unit capacitance and fast time constant. But this structure requires additional masks in fabrication to make unit capacitance high which requires more complicated processing techniques. Similarly, Poly-Insolator-Poly, or Poly-Insolator-Metal capacitors are other variations.

Figure 1C:
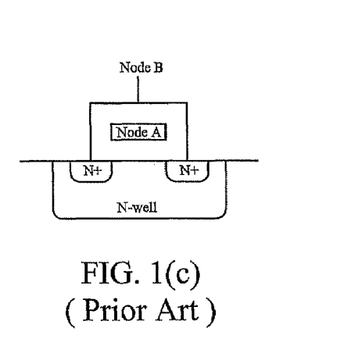
FIG. 1(c) presents a cross-sectional view of a thin-dielectric capacitor.

FIG. 1(c) presents a cross-sectional view of a thin-dielectric capacitor. The thin-dielectric capacitor can achieve the highest unit capacitance among the three kinds of conventional decoupling capacitors. But the time constant may be too long for high speed switching. Besides, the thin gate oxide is constantly biased at power supply voltage. This may create oxide integrity problems when the gate oxide thickness is less than 50 Å. As the oxide thickness becomes thinner with today's fabrication techniques, these issues, including stress failure and high leakage current, become significant. Also, if the capacitor is near an I/O pad, the electrostatic discharge (ESD) may cause the oxide breakdown.

Desirable in the art is an improved capacitor design that would improve upon the conventional thin-dielectric capacitor design.

SUMMARY

In view of the foregoing, this invention provides a novel thin-dielectric capacitor design by stacking multiple thin-dielectric capacitors to achieve high gate oxide integrity while providing high unit capacitance, low gate leakage current and adjustable time constant.

In one embodiment, a thin-dielectric unit capacitor is disclosed having a first node coupled to a first circuit connection point and a second node coupled to a second circuit connection point. It further contains a first and second thin-dielectric capacitors connected in series between the first and second nodes, wherein a thickness of a gate dielectric for each thin-dielectric capacitor is less than 50 angstroms.

The construction and method of operation of the invention, however, together with additional objects and advantages thereof will be best understood from the following description of specific embodiments when read in connection with the accompanying drawings.

DESCRIPTION

This invention will provide a detailed description of the art of stacking thin-dielectric capacitors for circuits using advanced technologies. The stacking thin-dielectric capacitor can achieve high gate oxide integrity, low leakage while providing high unit capacitance. The response time can be set to different values by adjusting poly width of the thin-dielectric capacitor. Each unit capacitor as disclosed may comprise at least two physical thin-dielectric capacitors coupled in series. The present invention is useful for high density integrated circuit applications where the thickness of capacitor gate dielectric layer is less than 50 Å in thickness and the minimum gate width for an active transistor on the same chip with the capacitors is 0.18 µm or less.

Figures 2A, 2B:
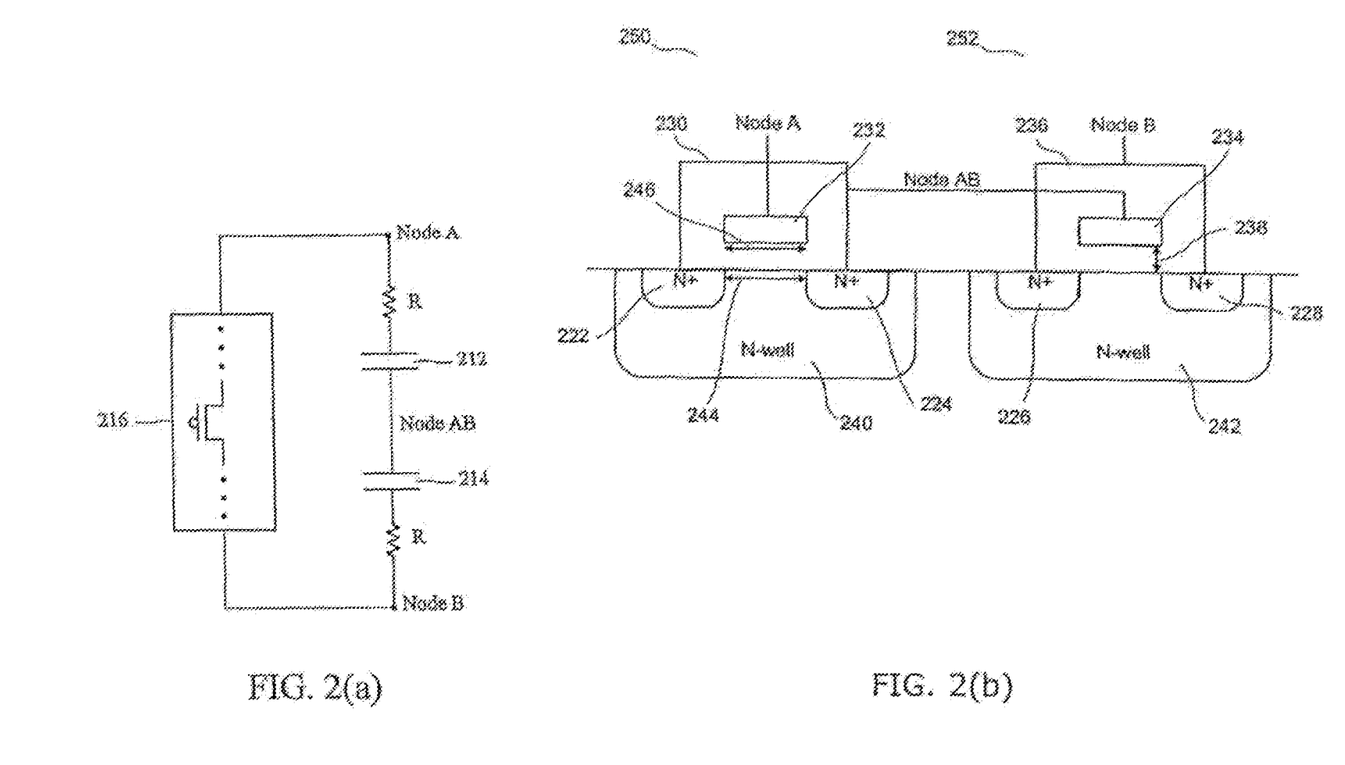
FIG. 2(a) illustrates the equivalent circuit schematics of a decoupling capacitor in accordance with one embodiment of the present invention.
FIG. 2(b) presents a cross-sectional view of a decoupling capacitor in accordance with the embodiment of FIG. 2(a).

FIG. 2(a) presents an equivalent circuit schematic 200 in accordance with one embodiment of the present invention. With the employment of this art, capacitor 212 and capacitor 214 are connected in series. The two capacitors 212 and 214 are further coupled to a circuit module 216 wherein one end, i.e., Node A, is assumed to be connected to a first circuit connection point with a first voltage level such as a positive power supply Vdd, and another end Node B, to a second circuit connection point with a second voltage level which can be a negative power supply Vss or ground. Node AB designates the point between the two capacitors. Provided these two capacitors have equal characteristics, the voltage on each capacitor is reduced to ½ of a single capacitor design the prior art. The coupled capacitors divides and decreases the stress on each capacitor such that less stress is imposed on the gate dielectric thereof, thereby significantly improving the gate dielectric stability and reducing the chance of breakdown. Further, when using two capacitors in series, the leakage current is cut significantly. It is recognized that the leakage current bears a general power law relationship with the voltage as represented by $Ig=V^{-n}$. While the unit capacitance is reduced by half, the increased lifetime of gate oxide integrity and the reduction of leakage current is much more than doubled because of the power law relationship on the voltage across a capacitor.

FIG. 2(b) shows a cross-sectional view of the two capacitors of FIG. 2(a) in accordance with one embodiment of the present invention. One of the capacitors on the left 250 is formed by N+ regions 222 and 224 over N well 240 and gate 232. And similarly, the other capacitor 252 is formed by N+ regions 226 and 228 over N well 242 and gate 234. These two capacitors are connected in series through any connection mechanism 230 such as a copper wire, shown as Node AB. Node AB connects the N+ region 222 or 224 of the capacitor 250 and the gate 234 of the capacitor 252. Node A is the gate 232 of the capacitor 250 and Node B is the N+ region 226 or 228 of the capacitor 252. Note that the thickness of the oxide dielectric layer 238 between the gate 234 and N-well 242 or between the gate 232 and N-well 240 in corresponding capacitor is less than 50 Å. In some cases, the thickness is less than 30 Å. The N-well profile depth can be less than 1.5 um, or even less than 1.0 um. It is further understood that the dopants for the source and drain regions of the capacitor can be of the same, as well as different, types as those used for bulk region such as the wells. In addition, if a contact is made in the N+ regions of the capacitor, the contact size thereof is less than 0.2 um.

As discussed in FIG. 2(a), with employment of this art, capacitor 250 and capacitor 252 are connected in series. When these two capacitors have the same capacitance, the voltage on each capacitor is equally distributed. Therefore, the voltage on the oxide 238 is reduced to ½ of the conventional design, while the stress lifetime is increased much more than ½ because of power law relationship. This significantly improves the gate dielectric stability on each capacitor such that the chance of gate breakdown is reduced.

Because the gate dielectric leakage current in ultra-thin oxide semiconductors is very sensitive to electrical stress, the leakage current significantly decreases as the stress voltage decreases. In this specific embodiment, because both capacitors have the same capacitance, the stress voltage is equally distributed on two capacitors. When the voltage on each gate is reduced to ½ of its normal value, the leakage current consequently drops to about ⅒ of its original value accordingly. In addition, with this specific embodiment of NMOS capacitors formed inside N-wells, it is easier to dissipate ESD charges, thereby reducing the chance of ESD damage to the unit capacitor.

Within this invention, each unit capacitor comprises at least two serial physical capacitors. The above disclosed design is particularly useful and advantageous when advanced technologies have shrunk the transistor gate size below 0.18 μm. When circuits are designed with these small transistors, the capacitors used for decoupling, delay, or bootstrapping purposes are preferred to have the thickness of the thin dielectric layer to be less than 50 Å while the minimum gate width of an active transistor on the same chip is less than 0.18 μm. The active transistor is shown schematically in circuit module 216 of FIG. 2(a).

Figure 3:
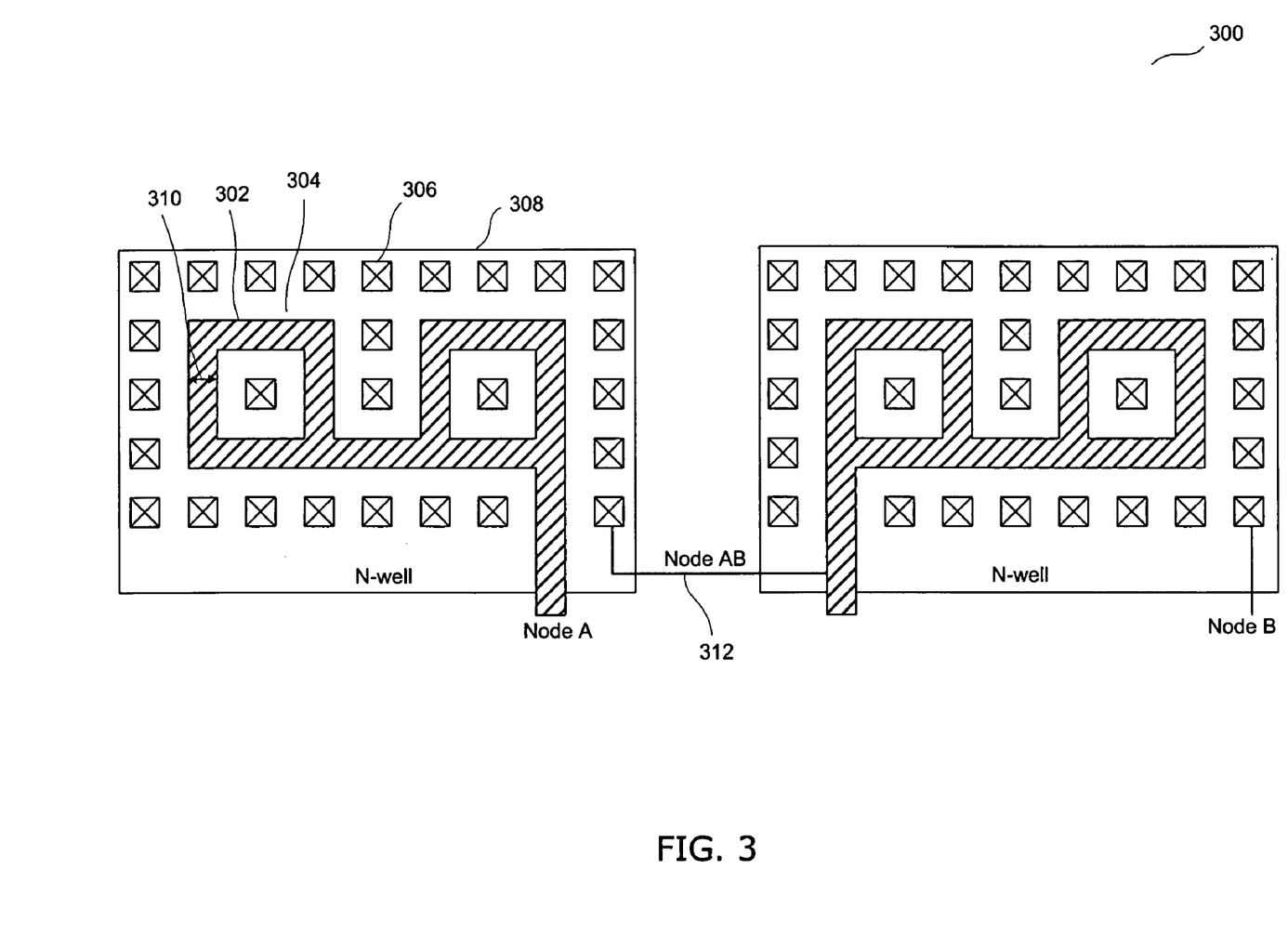
FIG. 3 presents a top view of a decoupling capacitor in accordance with one embodiment of the present invention.

FIG. 3 shows a top view of a layout of a stacked thin-dielectric capacitor 300 as disclosed above in accordance with one embodiment of the present invention. The stacked thin-dielectric capacitor can trade unit capacitance versus gate oxide stress. The poly 302 over a thin oxide material 304 forms the gate described as 232 in FIG. 2(b). All the contacts 306 over the same N-well 308 are connected as Node AB and have the same voltage. Two thin-dielectric capacitors are connected in series with copper wire 312. Since the capacitance of each capacitor depends also on the area of the "plate" or the poly gate area, it can be altered by adjusting the width and/or length of the gate material of the transistors. The width and length of each capacitor are typically about 10-20 um for relatively low time constant configurations.

Figure 5A:
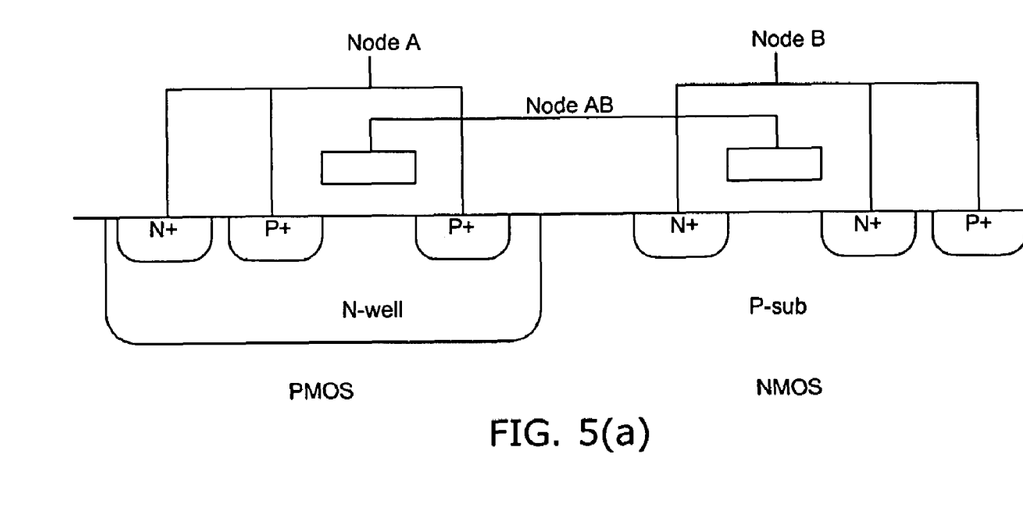
FIGS. 5(a) and (b) illustrate simplified schematics showing decoupling capacitors using both NMOS and PMOS devices according to one embodiment of the present invention.
Figure 5B:
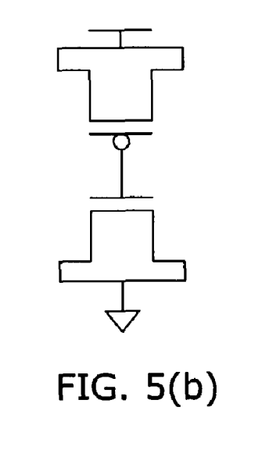

Note that the embodiment of the thin-dielectric capacitor above is the NMOS capacitors inside N-wells such the NMOS devices are always operated in accumulation region. As such, the time constant of the capacitor is determined by the response time of the majority carriers, rather than the minority carriers in the NMOS on P-substrate structures. However, it is understood that other types of capacitors such as devices operated in strong inversion can also be used. Same or different type of dopant for capacitor source/drain vs. bulk (N+ over N-well in P-substrate, P+ over P-substrate, N+ over P-substrate, P+ over N-well in P-substrate, NMOS, PMOS) may be used. The same can be applied to N-type substrate. As long as the capacitors are used in a stack fashion, they don't even have to be 4-terminal MOS transistors. FIGS. 5(a) and 5(b) show cross section and schematic views of an embodiment using both PMOS and NMOS connected as capacitors for the decoupling purposes.

Figure 4:
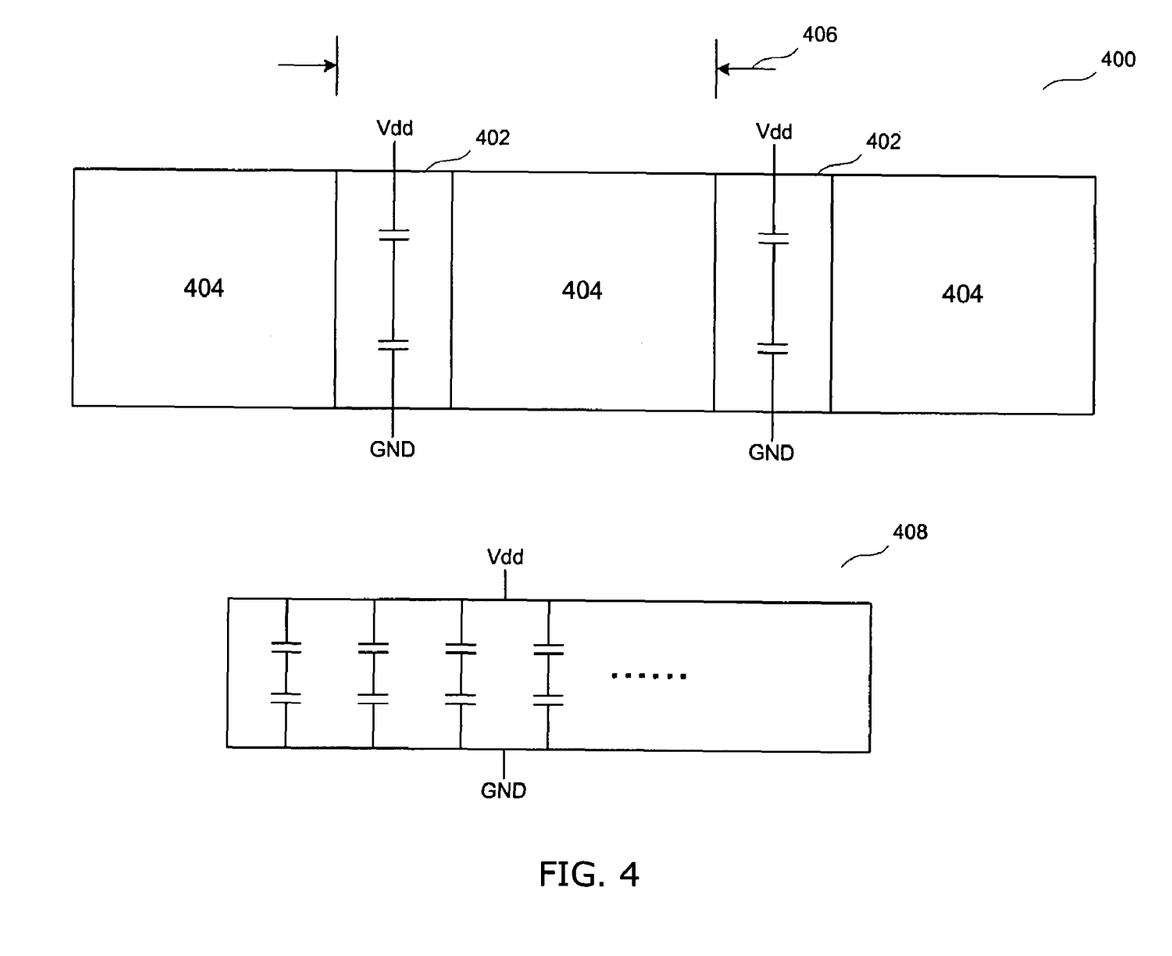
FIG. 4 illustrates a simplified circuit schematic with decoupling capacitors integrated therein according to one embodiment of the present invention.

Such stacked thin-dielectric capacitor art may be widely used for various purposes such as in Vdd/Vss decoupling, RC-delay circuits, bootstrap design applications, etc. This invention may be employed for designs comprising gate array or standard cell or device arrays. When placing the capacitors in the circuit, they can be in groups for a circuit, or for segments of the circuit. FIG. 4 illustrates two different capacitor arrangement designs. In the first embodiment, one or more stacked unit capacitors 402 are placed between circuit segments or modules 404. As shown, the capacitors are coupled between Vdd and Gnd for decoupling purposes. In most cases, the capacitors are coupled to either Vdd or Gnd through a resistance device. Especially for devices made by technologies of 0.13 um or beyond, a resistance device becomes more important. Furthermore, the decoupling stacked capacitors may be placed in certain distance interval 406 which is more than 100 μm. These distance intervals can be even or un-even in arrangement for the circuit. In some embodiment, the distance intervals may range from 100 to 500 μm. In another embodiment, multiple capacitors coupled in parallel are grouped together as a decoupling module 408, which is further associated with the circuit. This decoupling module 408 can be placed in different area of the circuit. If it can be placed as close as possible to circuit elements, the decoupling effect is better. In some implementations, the decoupling capacitors are usually hidden underneath the Vdd and Gnd buses to save space.

Figure 6:
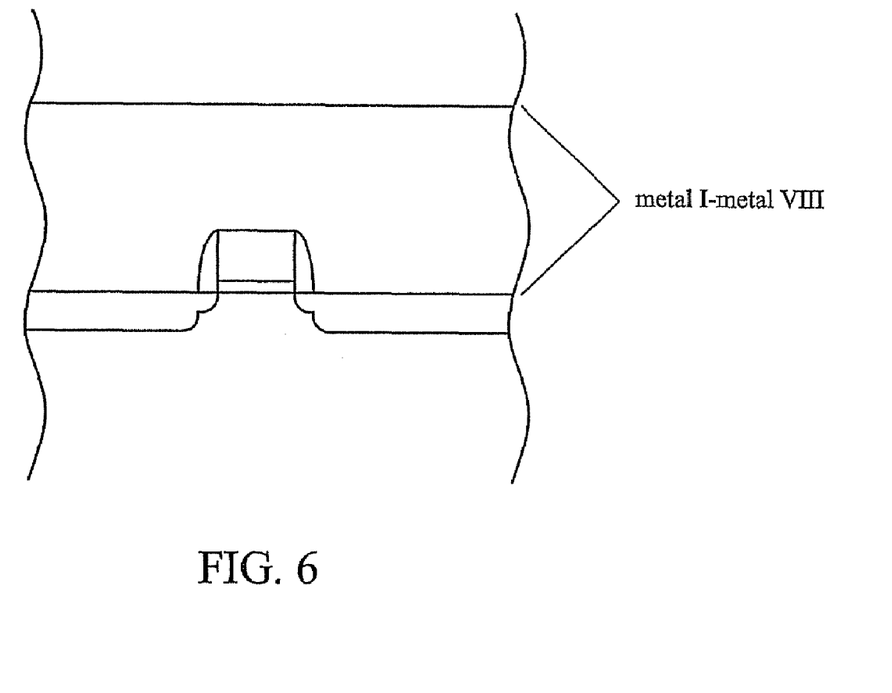
FIG. 6 shows a circuit device having a transistor with a metallization structure formed thereover.

This improved capacitor design may be widely used in IC designs with four to eight conductor layers in the metallization structure of the IC design. As understood by those in the art, metallization structure is formed over circuit devices to provide interconnections between components. The transistor of FIG. 6 represents a circuit device with the metallization structure including the aforementioned four to eight conductor layers formed thereover. One or more decoupling capacitors may be formed under one of power or ground buses in such IC design for at least one array or row of cells or devices formed in a horizontal or vertical direction or on one side of chip edges. This capacitor design can apply to standard cell design, gate array, fully custom or IP Library product applications. Further, the disclosed capacitor design can be stacked physical capacitors as well as MOS capacitors.

The described invention provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in a capacitor design, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A circuit incorporated with at least one decoupling thin-dielectric unit capacitor, the circuit comprising:
   one or more circuit modules;
   one or more decoupling modules coupled to the circuit modules, wherein each decoupling module having one or more unit capacitors each comprising:
      a first node coupled to a first circuit connection point of the circuit module;
      a second node coupled to a second circuit connection point of the circuit module; and
      two or more thin-dielectric capacitors connected in series between the first and second nodes,
   wherein a thickness of a gate dielectric for at least one thin-dielectric capacitor is less than 50 angstroms,
   wherein the decoupling module is arranged between any two circuit modules, and
   wherein the decoupling modules are placed with a predetermined distance interval between them, the distance interval being larger than 50 micron.

2. The circuit of claim 1 wherein the first node is coupled to a first power level and the second node to a second power level.

3. The circuit of claim 2 wherein the first power level is a positive power supply level.

4. The circuit of claim 2 wherein the second power level is ground.

5. The circuit of claim 2 wherein each unit capacitor is coupled to either the first or second power level through a resistor device.

6. The circuit of claim 1 wherein a capacitance of each capacitor in the unit capacitor is dependent on a width or length of a gate material.

7. The circuit of claim 1 wherein the circuit is manufactured to have at least four conducting layers.

8. The circuit of claim 7 wherein the circuit is manufactured to have eight or fewer conducting layers.

9. A circuit incorporated with at least one decoupling thin-dielectric unit capacitor, the circuit comprising;
   one or more circuit modules;
   one or more decoupling modules coupled to the circuit modules, wherein each decoupling module having one or more unit capacitors each comprising:
      a first node coupled to a first circuit connection point of the circuit module;
      a second node coupled to a second circuit connection point of the circuit module; and
      two or more thin-dielectric capacitors connected in series between the first and second nodes,
   wherein a thickness of a gate dielectric for at least one thin-dielectric capacitor is less than 50 angstroms,
   wherein the decoupling module has one or more unit capacitors arranged in parallel for providing a decoupling function for one or more circuit modules.

10. The circuit of claim 9,
    wherein the circuit has four to eight conducting layers after being manufactured, and
    wherein a gate width of an active transistor on the circuit is less than 0.18 micron.

11. The circuit of claim 9 wherein the decoupling module is arranged between an two circuit modules.

12. The circuit of claim 9 wherein the decoupling modules are placed with a predetermined distance interval between them, the distance interval being larger than 50 micron.

13. The circuit of claim 9 wherein the thickness of the gate dielectric for at least one thin-dielectric capacitor is less than 30 angstroms.

* * * * *

UNITED STATES PATENT AND TRADEMARK OFFICE
CERTIFICATE OF CORRECTION

PATENT NO.        : 7,301,217 B2
APPLICATION NO.   : 10/993711
DATED             : November 27, 2007
INVENTOR(S)       : Shine Chien Chung It is certified that error appears in the above-identified patent and that said Letters Patent is hereby corrected as shown below:

Column 6, line 19, delete "comprising;" and insert -- "comprising:" -- therefor.

Column 6, line 42, delete "an" and insert -- any -- therefor.

Signed and Sealed this

Eighth Day of April, 2008

JON W. DUDAS
*Director of the United States Patent and Trademark Office*